(12) United States Patent
Muraki et al.

(10) Patent No.: US 7,378,671 B2
(45) Date of Patent: May 27, 2008

(54) ABERRATION MEASURING APPARATUS FOR CHARGED PARTICLE BEAM OPTICAL SYSTEM, CHARGED PARTICLE BEAM LITHOGRAPHY MACHINE HAVING THE ABERRATION MEASURING APPARATUS, AND DEVICE FABRICATION METHOD USING THE APPARATUS

(75) Inventors: Masato Muraki, Inagi (JP); Hiroya Ohta, Kodaira (JP)

(73) Assignees: Canon Kabushiki Kaisha, Tokyo (JP); Hitachi High-Technologies Corporation, Tokyo (JP)

( * ) Notice: Subject to any disclaimer, the term of this patent is extended or adjusted under 35 U.S.C. 154(b) by 284 days.

(21) Appl. No.: 11/337,603

(22) Filed: Jan. 24, 2006

(65) Prior Publication Data
US 2006/0169898 A1    Aug. 3, 2006

(30) Foreign Application Priority Data
Jan. 26, 2005    (JP)    ............................. 2005-017698

(51) Int. Cl.
*H01J 37/304*    (2006.01)
(52) U.S. Cl. ............................................... 250/492.22
(58) Field of Classification Search ................ None
See application file for complete search history.

(56) References Cited

U.S. PATENT DOCUMENTS

| | | | |
|---|---|---|---|
| 4,198,569 A * | 4/1980 | Takayama | 250/492.2 |
| 5,747,814 A * | 5/1998 | Gordon et al. | 250/398 |
| 5,834,783 A | 11/1998 | Muraki et al. | 250/398 |
| 5,864,142 A | 1/1999 | Muraki et al. | 250/491.1 |
| 5,905,267 A | 5/1999 | Muraki | 250/492.22 |
| 5,929,454 A | 7/1999 | Muraki et al. | 250/491.1 |
| 5,939,725 A | 8/1999 | Muraki | 250/492.22 |
| 5,973,332 A | 10/1999 | Muraki et al. | 250/492.2 |
| 5,981,954 A | 11/1999 | Muraki | 250/397 |
| 6,037,601 A | 3/2000 | Okunuki | 250/492.23 |
| 6,054,713 A | 4/2000 | Miyake et al. | 250/492.24 |

(Continued)

FOREIGN PATENT DOCUMENTS

JP    9-245708    9/1997

(Continued)

*Primary Examiner*—Jack I Berman
(74) *Attorney, Agent, or Firm*—Fitzpatrick, Cella, Harper & Scinto

(57) ABSTRACT

A charged particle beam lithography machine for exposing a target exposure surface by using a plurality of charged particle beams. The machine includes a charged particle source to emit a charged particle beam, an aperture substrate which has a plurality of apertures to divide the charged particle beam from the charged particle source into a plurality of charged particle beams, a plurality of electron optical systems which have the apertures as pupils, a charged particle beam optical system which projects, to the target exposure surface, charged particle source images formed by the plurality of electron optical systems, a unit adapted to set the apertures of the aperture substrate to an aperture for exposure and an aperture for aberration measurement to make the plurality of charged particle beams strike the charged particle beam optical system at different incident angles, and a detecting unit adapted to detect a position where the plurality of charged particle beams, which have passed through the aperture for aberration measurement, form images on an image surface of the charged particle beam optical system.

6 Claims, 12 Drawing Sheets

U.S. PATENT DOCUMENTS

| | | | |
|---|---|---|---|
| 6,104,035 A | 8/2000 | Muraki | 250/492.22 |
| 6,107,636 A | 8/2000 | Muraki | 250/492.2 |
| 6,124,599 A | 9/2000 | Muraki | 250/492.22 |
| 6,137,113 A | 10/2000 | Muraki | 250/492.22 |
| 6,166,387 A | 12/2000 | Muraki et al. | 250/492.2 |
| 6,323,499 B1 | 11/2001 | Muraki et al. | 250/492.22 |
| 6,337,485 B1 | 1/2002 | Muraki | 250/492.2 |
| 6,392,243 B1 | 5/2002 | Muraki | 250/491.1 |
| 6,455,211 B1 | 9/2002 | Yui et al. | 430/22 |
| 6,472,672 B1 | 10/2002 | Muraki | 250/492.2 |
| 6,552,353 B1 | 4/2003 | Muraki | 250/492.2 |
| 6,559,456 B1 | 5/2003 | Muraki | 250/491.1 |
| 6,566,664 B2 | 5/2003 | Muraki | 250/492.2 |
| 6,583,430 B1 | 6/2003 | Muraki | 250/492.22 |
| 6,657,210 B1 | 12/2003 | Muraki | 250/492.22 |
| 6,835,937 B1 | 12/2004 | Muraki et al. | 250/396 R |
| 6,864,488 B2 | 3/2005 | Muraki | 250/442.11 |
| 6,870,171 B2 | 3/2005 | Hosoda et al. | 250/492.22 |
| 6,903,353 B2 | 6/2005 | Muraki et al. | 250/492.22 |
| 6,946,665 B2 | 9/2005 | Muraki et al. | 250/492.1 |
| 6,953,938 B2 | 10/2005 | Iwasaki et al. | 250/396 R |
| 6,965,153 B1 | 11/2005 | Ono et al. | 257/448 |
| 6,982,427 B2 | 1/2006 | Kawasaki et al. | 250/396 R |
| 7,005,658 B2 | 2/2006 | Muraki | 250/492.22 |
| 7,038,226 B2 | 5/2006 | Ono et al. | 250/492.3 |
| 7,126,141 B2 | 10/2006 | Ono et al. | 250/492.23 |
| 7,173,262 B2 | 2/2007 | Hosoda et al. | 250/492.22 |
| 7,189,979 B2 | 3/2007 | Okunuki et al. | 250/492.2 |
| 7,261,985 B2 * | 8/2007 | Smith et al. | 430/30 |
| 2006/0169898 A1 | 8/2006 | Muraki et al. | 250/310 |
| 2006/0169927 A1 | 8/2006 | Muraki et al. | 250/492.23 |

FOREIGN PATENT DOCUMENTS

JP     2004-153245     5/2004

* cited by examiner

FIG. 6A
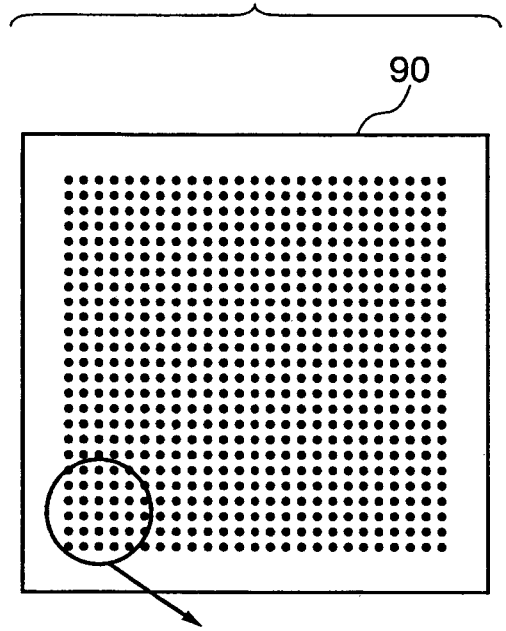
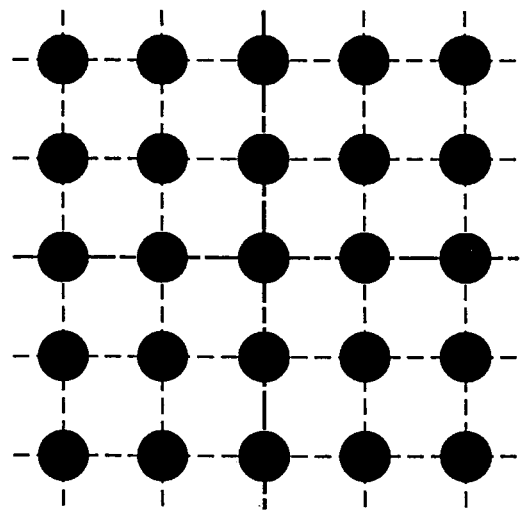
FIG. 6B
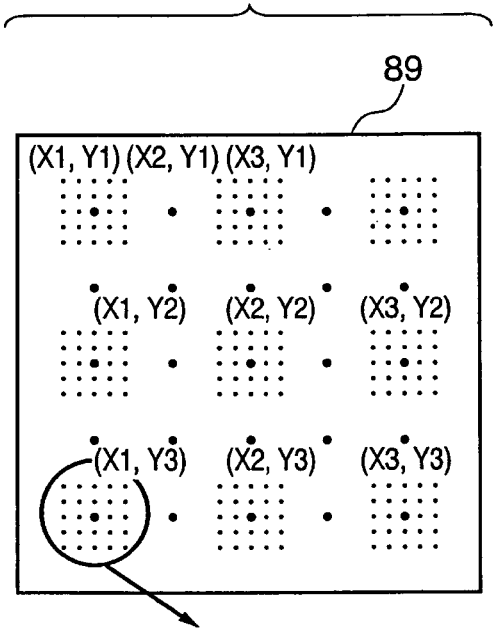
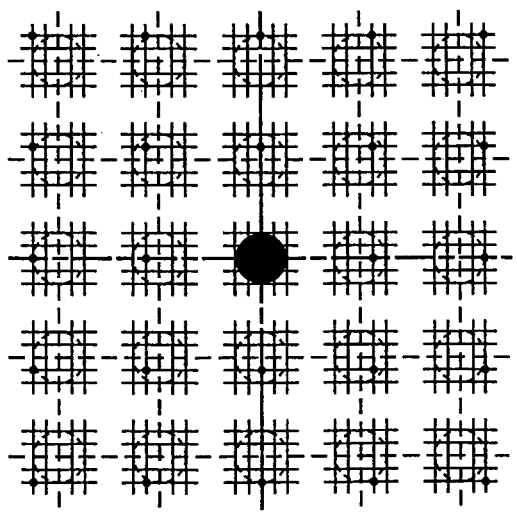

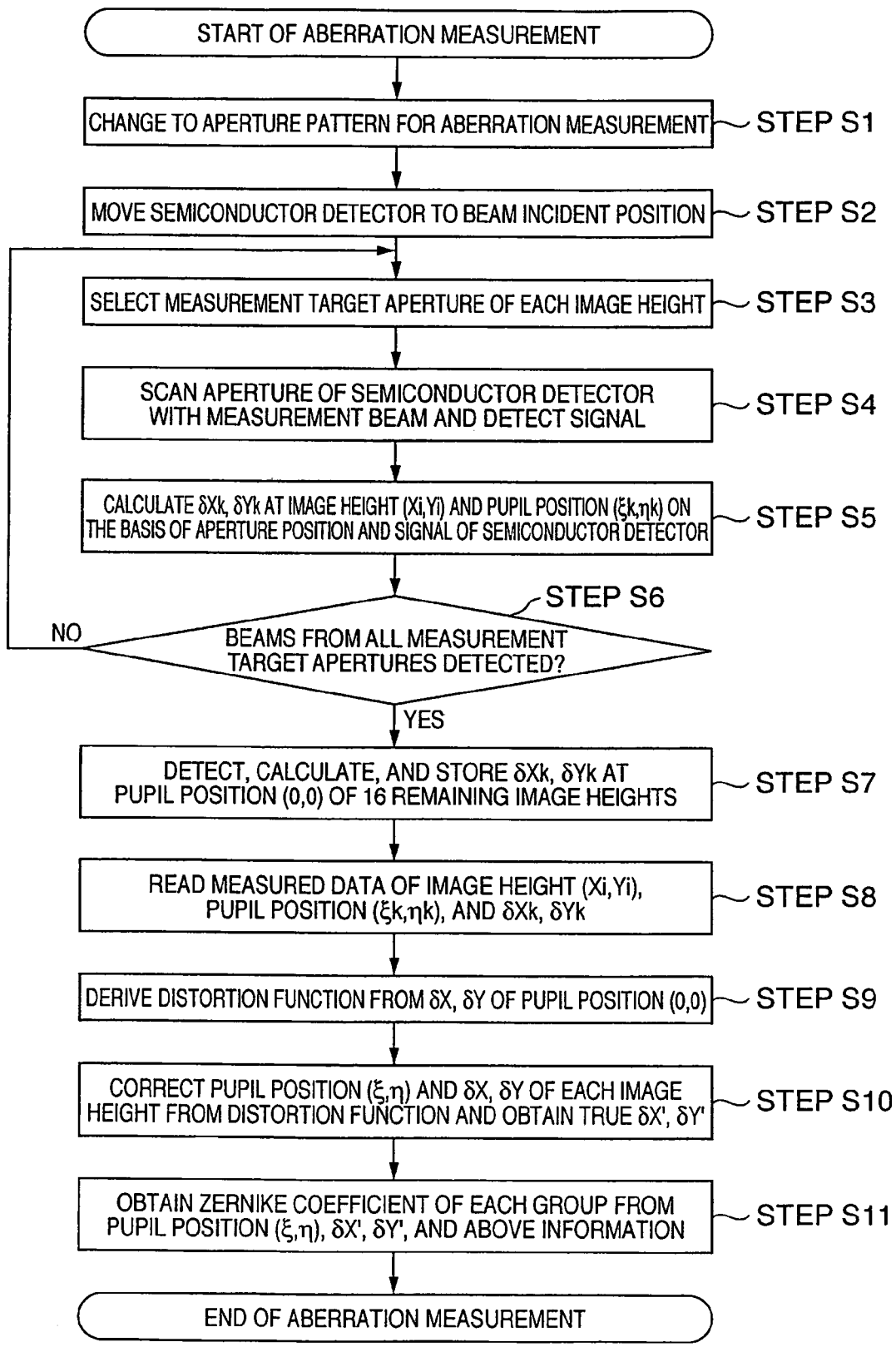

ABERRATION MEASURING APPARATUS FOR CHARGED PARTICLE BEAM OPTICAL SYSTEM, CHARGED PARTICLE BEAM LITHOGRAPHY MACHINE HAVING THE ABERRATION MEASURING APPARATUS, AND DEVICE FABRICATION METHOD USING THE APPARATUS

FIELD OF THE INVENTION

The present invention relates to an aberration measuring apparatus for a charged particle beam optical system, and a charged particle beam lithography machine, such as an electron beam lithography machine or ion beam lithography machine, which has the aberration measuring apparatus and is mainly used for exposure of a semiconductor integrated circuit.

BACKGROUND OF THE INVENTION

Conventional electron beam lithography machines, include machines of a point beam type, which use a spot-shaped beam, and machines of a variable rectangular beam type, which use a beam having a rectangular section with a variable size.

An electron beam lithography machine of a point beam type performs drawing by using a single electron beam. Hence, this machine has a low throughput and is used only for research and development. The throughput of an electron beam lithography machine of a variable rectangular beam type is higher than that of a point beam type by one or two orders of magnitude. However, this type also basically executes drawing by using a single electron beam, so there is still a problem of throughput in exposing a pattern in which fine patterns of about 0.1 μm are integrated at a high density.

As a machine to solve this problem, there is an electron beam lithography machine of a stencil mask type. In this machine, a pattern to be drawn is formed as pattern conduction pores in a stencil mask. Then, the pattern to be drawn is transferred to the sample surface through a reduced electron optical system by irradiating the stencil mask with an electron beam. As another method, a multi-electron beam lithography machine is used. A substrate having a plurality of apertures is irradiated with an electron beam to irradiate a sample surface with a plurality of electron beams from the plurality of apertures through a reduced electron optical system. The sample surface is scanned by deflecting the plurality of electron beams. The plurality of electron beams are individually turned on/off in accordance with the pattern to be drawn, thereby drawing the pattern. In all methods described above, the throughput can be improved because they are to be exposed at once, i.e., the exposure area is wider than before.

Japanese Patent Laid-Open No. 9-2145708 discusses a sequence controller which sends an exposure control file stored in a memory to a deflection control circuit. In the deflection control circuit, based on position data in the exposure control file that was transmitted, a deflection control signal, a focus control signal, and a non-point correction signal are transmitted to a deflector, a dynamic focus coil, and a dynamic sting coil synchronized with a blanking control circuit, respectively, and the position of plural light source images is controlled on a wafer.

SUMMARY OF THE INVENTION

The reduced electron optical system of an electron beam lithography machine of a stencil mask type or a multi-electron beam lithography machine must be adjusted to suppress aberration in balance in the entire exposure field, wider than usual. To do this, it is necessary to separately measure spherical aberration, coma, astigmatism, displacement, and focus position at each image height in the entire exposure field and to execute adjustment on the basis of the measurement result. However, in conventional aberration measurement, defocus of a beam and its position are only measured so aberration cannot be suppressed in balance in the entire exposure field.

It is an aspect of the present invention to provide an aberration measuring machine capable of separately measuring an aberration of a charged particle beam optical system and adjusting in balance an aberration in the effective field of the charged particle beam optical system.

The present invention has been made in consideration of the above-described conventional problems and a form of an aberration measuring machine for measuring an aberration of a charged particle beam optical system of the present invention comprises a charged particle generating unit adapted to make a plurality of charged particle beams strike an object plane of the charged particle beam optical system at different incidence angles, and a detecting unit adapted to detect a position where the plurality of charged particle beams form images on an image surface of the charged particle beam optical system.

In a preferred embodiment, the charged particle generating unit comprises, e.g., electron optical systems corresponding to the charged particle beams and an aperture stop to make the charged particle beams corresponding to pupil positions of the electron optical systems strike the object plane at different incidence angles.

In a preferred embodiment, the aberration is obtained on the basis of a detection result from the detecting unit and a distortion of the charged particle beam optical system.

In a preferred embodiment, the plurality of charged particle beams pass through, e.g., different object planes, and the aberration is obtained by regarding the object planes as the same image height.

In a preferred embodiment, the charged particle generating unit further comprises, e.g., a unit adapted to make the plurality of charged particle beams strike the object plane of the charged particle beam optical system at an equal incidence angle, the detecting unit detects the image positions, and the distortion is obtained on the basis of the detection result.

The machine further comprises a calculating unit adapted to divide the aberration into components by using a Zernike coefficient.

A form of a charged particle beam lithography machine for exposing a target exposure surface by using a plurality of charged particle beams of the present invention comprises a charged particle source to emit a charged particle beam, an aperture substrate, which has a plurality of apertures to divide the charged particle beam from the charged particle source into a plurality of charged particle beams, a plurality of electron optical systems, which have the apertures as pupils, a charged particle beam optical system, which projects, to the target exposure surface, charged particle source images formed by the plurality of electron optical systems, a unit adapted to set the apertures of the aperture substrate to an aperture for exposure and an aperture for aberration measurement to make the plurality of charged particle beams strike the charged particle beam optical system at different incidence angles, and a detecting unit adapted to detect a position where the plurality of charged particle beams, which have passed through the aperture for aberration measurement, form images on an image surface of the charged particle beam optical system.

In a preferred embodiment, an aberration is obtained on the basis of a detection result from the detecting unit and a distortion of the charged particle beam optical system.

In a preferred embodiment, the plurality of charged particle beams which have passed through the aperture for aberration measurement pass through, e.g., different object planes, and the aberration is obtained by regarding the object planes as substantially the same image height.

In a preferred embodiment, the aperture for aberration measurement makes, e.g., the plurality of charged particle beams strike an object plane of the charged particle beam optical system at an equal incidence angle, the detecting unit detects the image positions, and the distortion is obtained on the basis of the detection result.

The machine further comprises a calculating unit adapted to divide the aberration into components by using a Zernike coefficient.

A form of a device fabrication method of the present invention is characterized by comprising steps of exposing an exposure target by using the above charged particle beam lithography machine and developing the exposed exposure target.

As described above, according to the present invention, the aberration of the charged particle beam optical system can separately be measured, and the aberration in the effective field of the charged particle beam optical system can be adjusted in balance.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6A is an explanatory view of an aperture pattern for exposure in the aperture array of the electron beam lithography machine to which the aberration adjusting method of the charged particle beam optical system in the lithography machine according to the embodiment of the present invention is applied;

FIG. 6B is an explanatory view of an aperture pattern for aberration measurement in the aperture array of the electron beam lithography machine to which the aberration adjusting method of the charged particle beam optical system in the lithography machine according to the embodiment of the present invention is applied;

FIG. 9 is an explanatory view of the aberration measuring operation in the aberration adjusting method of the charged particle beam optical system in the lithography machine according to the embodiment of the present invention;

DETAILED DESCRIPTION OF THE PREFERRED EMBODIMENTS

As a charged particle beam lithography machine according to an embodiment of the present invention, an electron beam lithography machine will be exemplified. The present invention can also be applied to a lithography machine using, not an electron beam, but an ion beam.

First Embodiment

<Description of Constituent Elements and Drawing Method of an Electron Beam Lithography Machine>

Figure 1:
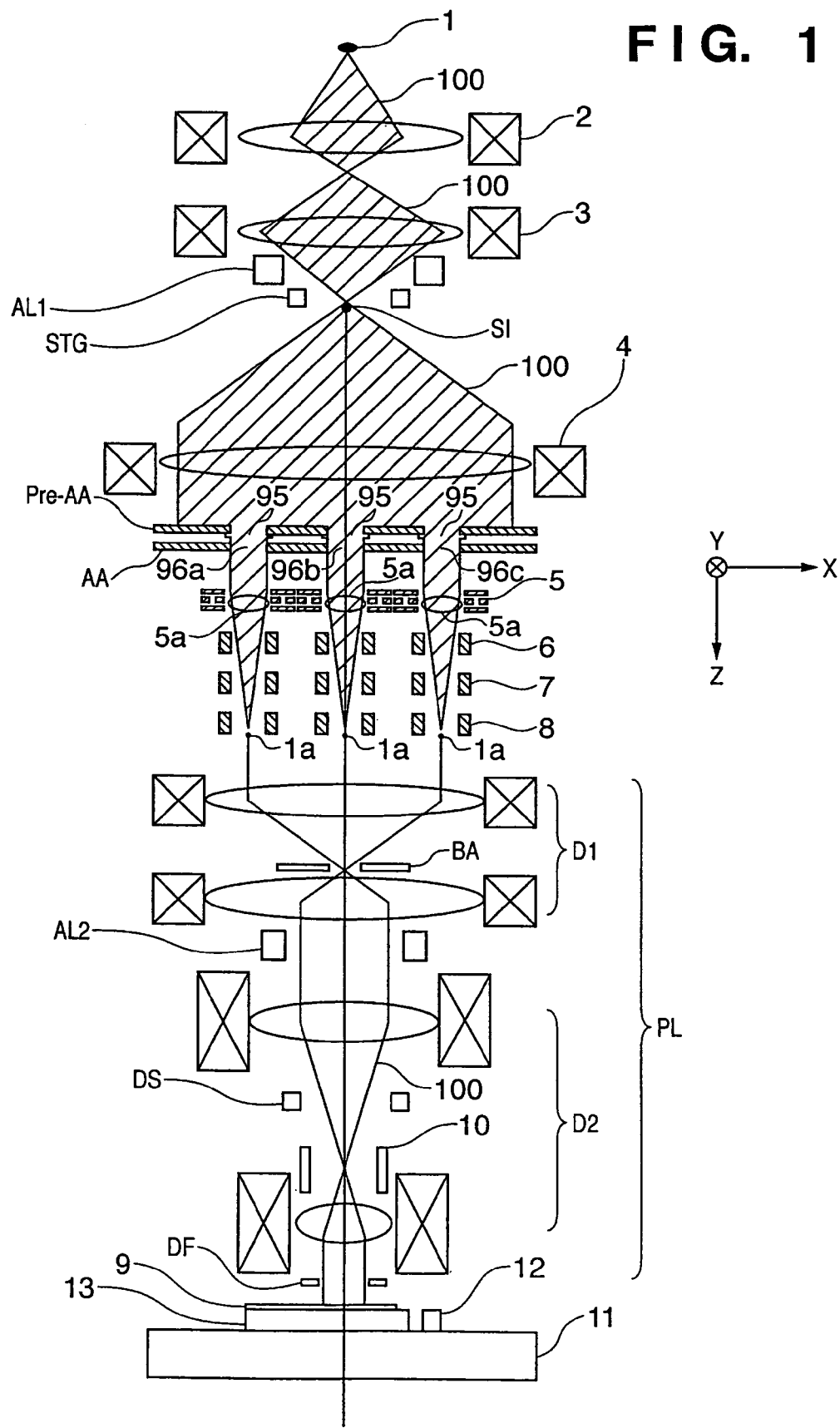
FIG. 1 is a schematic view showing the main part of an electron beam lithography machine to which the aberration adjusting method of the charged particle beam optical system in a lithography machine according to an embodiment of the present invention is applied.

FIG. 1 is a schematic view showing the main part of an electron beam lithography machine according to the present invention.

An electron beam generated by an electron gun (not shown) forms an electron source 1 as a cross-over image. An electron beam 100 emitted from the electron source 1 forms an image SI of the electron source 1 through beam shaping optical systems 2 and 3. The size of the image SI of the electron source 1 can be changed by adjusting the lens power of each of the beam shaping optical systems 2 and 3. The electron beam 100 radiated from the image SI is changed to an almost parallel electron beam 100 through a collimating lens 4. An aperture array AA is formed by two-dimensionally arraying apertures 96a, 96b, and 96c. A pre-aperture array Pre-AA is formed by two-dimensionally arraying apertures 95 larger than the apertures 96a, 96b, and 96c of the aperture array AA in the same pattern as that of the aperture array AA. This structure reduces thermal damage to the aperture array AA by electron beam irradiation. A lens array 5 is formed by two-dimensionally arraying electrostatic lenses 5a having the same optical power. Each of deflector arrays 6 and 7 is formed by two-dimensionally arraying individually drivable eight-pole electrostatic deflectors. A blanker array 8 is formed by two-dimensionally arraying individually drivable electrostatic blankers. The almost parallel electron beam 100 from the collimating lens 4 is divided into a plurality of electron beams 100 by the aperture array AA. Each of the divided electron beams 100 forms an intermediate image 1a of the electron source 1 on a corresponding blanker of the blanker array 8 through a corresponding electrostatic lens 5a of the lens array 5 corresponds to one of the apertures of the aperture array AA.

A reduced optical projecting system PL including two stages of symmetric magnetic doublet lenses D1 and D2 is provided downstream of the plane of the intermediate image 1a to project a plurality of intermediate images 1a onto a wafer 9. The pupil of the reduced projecting optical system PL and the aperture of the aperture array AA have a conjugated relation.

The deflector arrays 6 and 7 can individually adjust the positions (positions in a plane perpendicular to the optical axis) of the intermediate images 1a of the electron source 1, which are formed on the blanker array 8. The positions of the plurality of intermediate images 1a of the electron source 1 can be adjusted systematically by excitation of the collimating lens 4 an astigmatism (Stig) meter STG arranged near the light source image SI. When the blanker array 8 deflects the electron beams 100, they are shielded by a blanking aperture BA so that irradiation of the wafer 9 with the electron beams 100 can be controlled. In the doublet lens D2 of the lower stage, a deflector 10 to simultaneously displace the plurality of electron beams 100 to desired positions in the X and Y directions, a Stig member DS serving as an eight-pole electrostatic Stig meter to simultaneously adjust the astigmatism of the plurality of electron beams 100, and a focus coil DF to simultaneously adjust the focus of the plurality of electron beams 100 are arranged. A first aligner AL1 serving as an optical axis adjusting aligner is arranged between the beam shaping optical system 3 and the collimating lens 4. A second aligner AL2 serving as an optical axis adjusting aligner is arranged between the doublet lenses D1 and D2. An X-Y stage 11 having the wafer 9 thereon is designed to be movable in the X and Y directions perpendicular to the optical axis. An electrostatic chuck 13 to fix the wafer 9 and a semiconductor detector 12 having an aperture pattern on the incident side of the electron beams 100 to measure the positions of the electron beams 100 are arranged on the X-Y stage 11.

Figure 2:
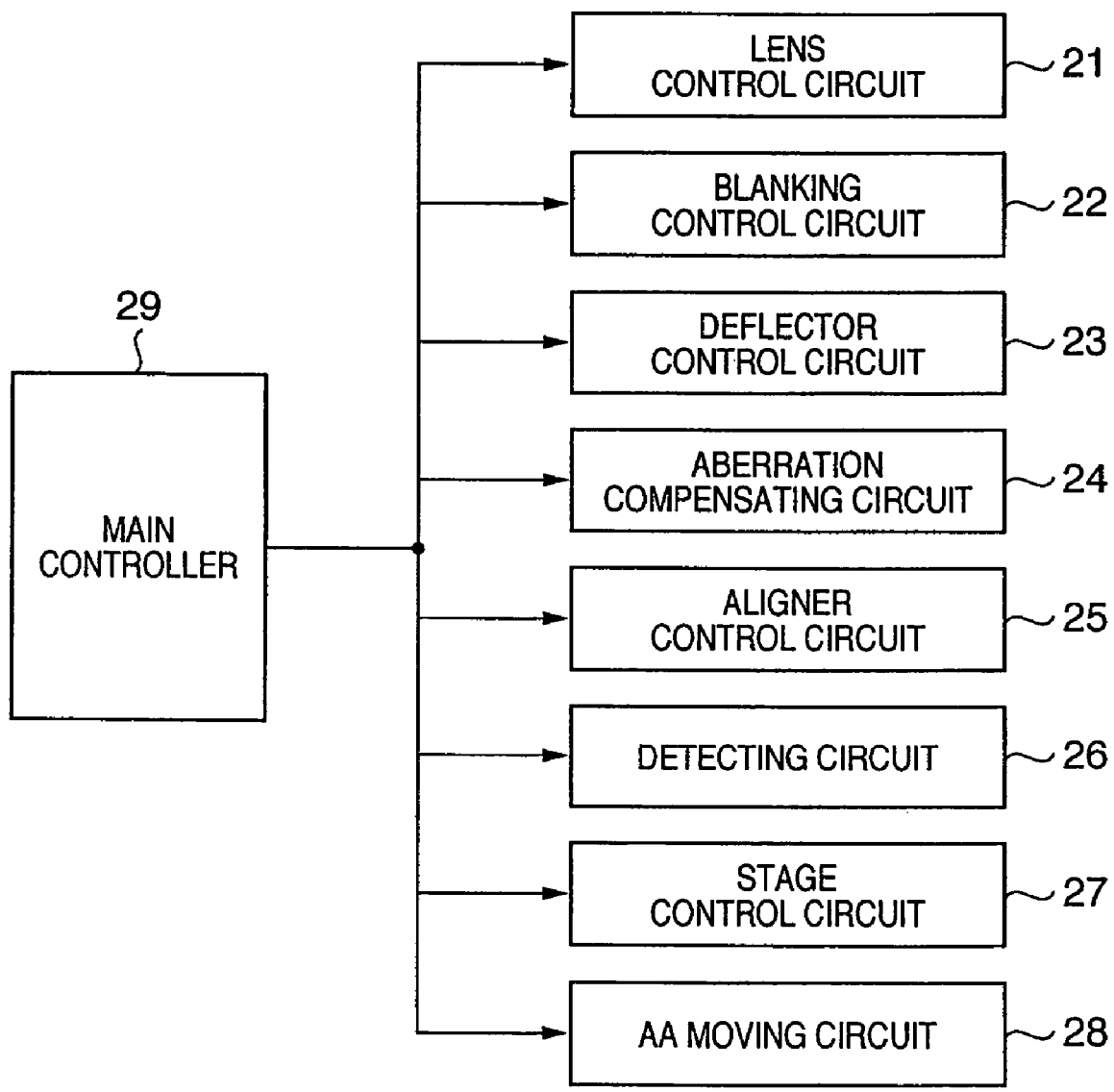
FIG. 2 is a block diagram showing the system configuration of the electron beam lithography machine to which the aberration adjusting method of the charged particle beam optical system in the lithography machine according to the embodiment of the present invention is applied.

FIG. 2 shows the system configuration.

A lens control circuit 21 controls the electrooptic power (focal lengths) of each of the beam shaping optical systems 2 and 3, collimating lens 4, lens array 5, and symmetric magnetic doublet lenses D1 and D2. A blanking control circuit 22 individually controls the plurality of blankers of the blanker array 8. A deflector control circuit 23 controls the main deflector 10. An aberration compensating circuit 24 adjusts generated aberration by controlling the deflector arrays 6 and 7, Stig meter DS, and focus coil aligners AL1 and AL2 to adjusting the optical axis. A detecting circuit 26 processes a signal from the semiconductor detector 12. A stage control circuit 27 drives and controls the X-Y stage 11 together with a laser interferometer (not shown) to detect the position of the X-Y stage 11. An AA moving circuit 28 switches the horizontal position of the aperture array AA. A main controller 29 controls the plurality of control circuits described above and manages the entire electron beam lithography machine.

Figure 3:
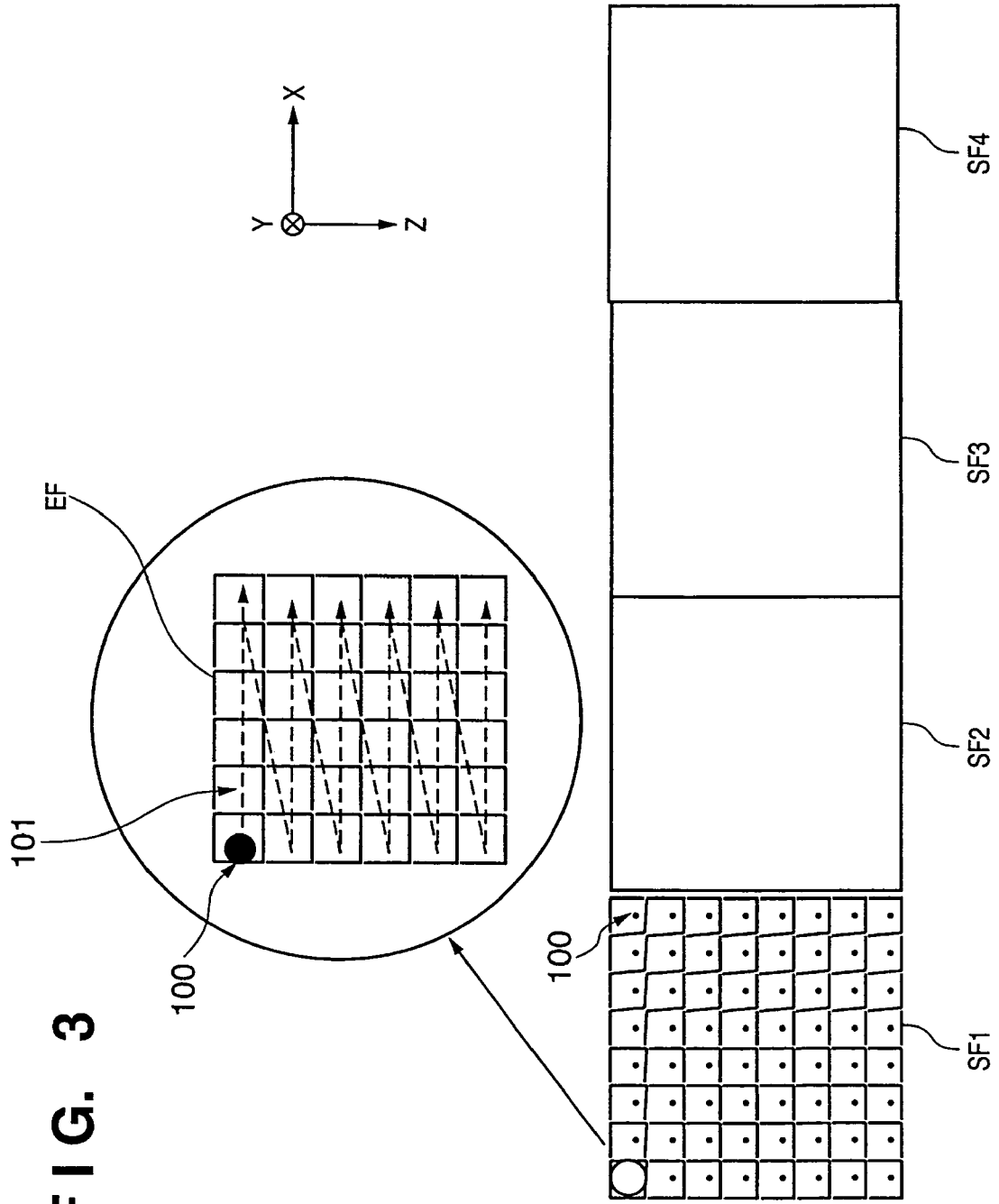
FIG. 3 is an explanatory view of a drawing method by the electron beam lithography machine to which the aberration adjusting method of the charged particle beam optical system in the lithography machine according to the embodiment of the present invention is applied.
Figure 4:
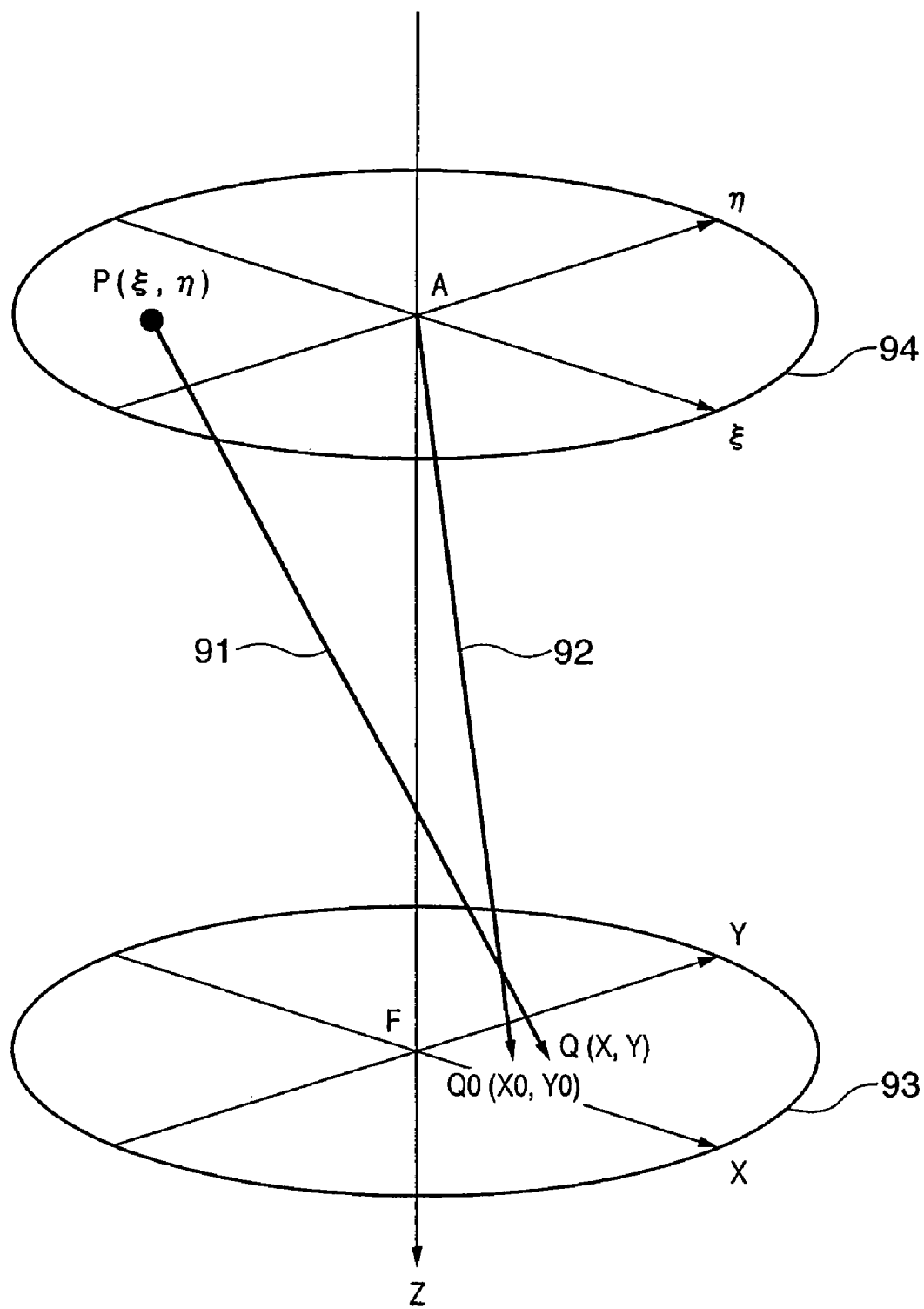
FIG. 4 is an explanatory view of geometrical aberration by the electron beam lithography machine to which the aberration adjusting method of the charged particle beam optical system in the lithography machine according to the embodiment of the present invention is applied.

FIG. 3 is an explanatory view of the drawing method of this embodiment.

The main controller 29 instructs the blanking control circuit 22 and deflector control circuit 23 on the basis of exposure control data to cause the deflector 10 to deflect the plurality of electron beams 100. Simultaneously, the main controller 29 individually turns on/off the blankers of the blanker array 8 in accordance with pixels 101 to be exposed to the wafer 9.

Each electron beam 100 raster-scan-exposes a corresponding unit exposure field (EF) on the wafer 9, as shown in FIG. 3. The unit exposure fields (EF) of the electron beams 100 are set to be two-dimensionally adjacent to each other. As a result, a sub field (SF) including a plurality of unit exposure fields (EF) exposed simultaneously is exposed. After sub field 1 (SF1) is exposed, the main controller 29 causes the deflector 10 to deflect the plurality of electron beams 100 to the next sub field 2 (SF2) to expose it.

<Description of Aberration Measurement>

A point A is defined as the central point of an exit pupil 94. A point F is defined as a Gaussian image point. A plane perpendicular to the optical axis passing through the point F is defined as an image plane 93. X- and Y-axes are set on the image plane 93. The intersection between the image plane 93 and a principal ray 92 passing through the point A is defined as Q0 (X0, Y0). Supposing that Q is the point where a beam 91 that has exited from an arbitrary point P on the plane of the exit pupil 94 crosses the image plane 93, geometrical aberration of the point P with respect to Q0 (image height) is represented by Q−Q0(δX, δY). The geometrical aberration is given by $$\sigma X = \frac{\partial W(\rho, \theta)}{\partial \xi} \quad (1\text{-}1)$$

$$\sigma Y = \frac{\partial W(\rho, \theta)}{\partial \eta} \quad (1\text{-}2)$$

wherein, $W(\rho,\theta) = \sum_n C_n Z_n(\rho,\theta)$ ($\xi = \rho \cos\theta, \eta = \rho \sin\theta$)

where $W(\rho, \theta)$ is wave aberration expressed by a Zernike polynomial.

Basic matters of expression by Zernike polynomials will be described.

In expression by Zernike polynomials, a polar coordinate system is used as a coordinate system, and a Zernike cylindrical function is used as an orthogonal system. In this case, $\rho$ is a normalized pupil radius obtained by normalizing the radius of the exit pupil to 1, θ is the radius angle of the polar coordinates, and Cn is an expansion coefficient.

Table 1 shows, of a Zernike cylindrical system $Zn(\rho, \theta)$, cylindrical functions Z1 to Z16 of the first to sixteenth terms and aberration of each term.

TABLE 1

| Expansion Coefficient | Cylindrical Function | Aberration |
|---|---|---|
| C1 | 1 | constant term |
| C2 | $\rho\cos\theta$ | distortion |
| C3 | $\rho\sin\theta$ | distortion |
| C4 | $2\rho^2 - 1$ | defocus |
| C5 | $\rho^2\cos 2\theta$ | astigma |
| C6 | $\rho^2\sin 2\theta$ | astigma |
| C7 | $(3\rho^2 - 2)\rho\cos\theta$ | coma |
| C8 | $(3\rho^2 - 2)\rho\sin\theta$ | coma |
| C9 | $6\rho^4 - 6\rho^2 + 1$ | spherical |
| C10 | $\rho^2\cos 3\theta$ | trefoil |
| C11 | $\rho^2\sin 3\theta$ | trefoil |
| C12 | $(4\rho^4 - 3\rho^2)\rho\cos 2\theta$ | astigma |
| C13 | $(4\rho^4 - 3\rho^2)\rho\sin 2\theta$ | astigma |
| C14 | $(10\rho^5 - 12\rho^3 + 3\rho)\cos\theta$ | coma |
| C15 | $(10\rho^5 - 12\rho^3 + 3\rho)\sin\theta$ | coma |
| C16 | $20\rho^5 - 30\rho^4 + 12\rho^2 + 1$ | spherical |

To measure aberration, an aperture to pass only specified beams is formed in the exit pupil plane. The displacement between the Gaussian image point and the image of the beam on the image plane is measured. The displacement is measured by sequentially changing the location of the specified beam on the exit pupil plane. The expansion coefficient Cn of each term is obtained by fitting the Zernike cylindrical system $Zn(\rho, \theta)$ to the displacement information. The wave aberration $W(\rho, \theta)$ can finally be obtained by using the expansion coefficient Cn and Zernike cylindrical system $Zn(\rho, \theta)$.

Characteristic features of the aberration measuring method of this embodiment will be described next with reference to FIG. 5.

Figure 5:
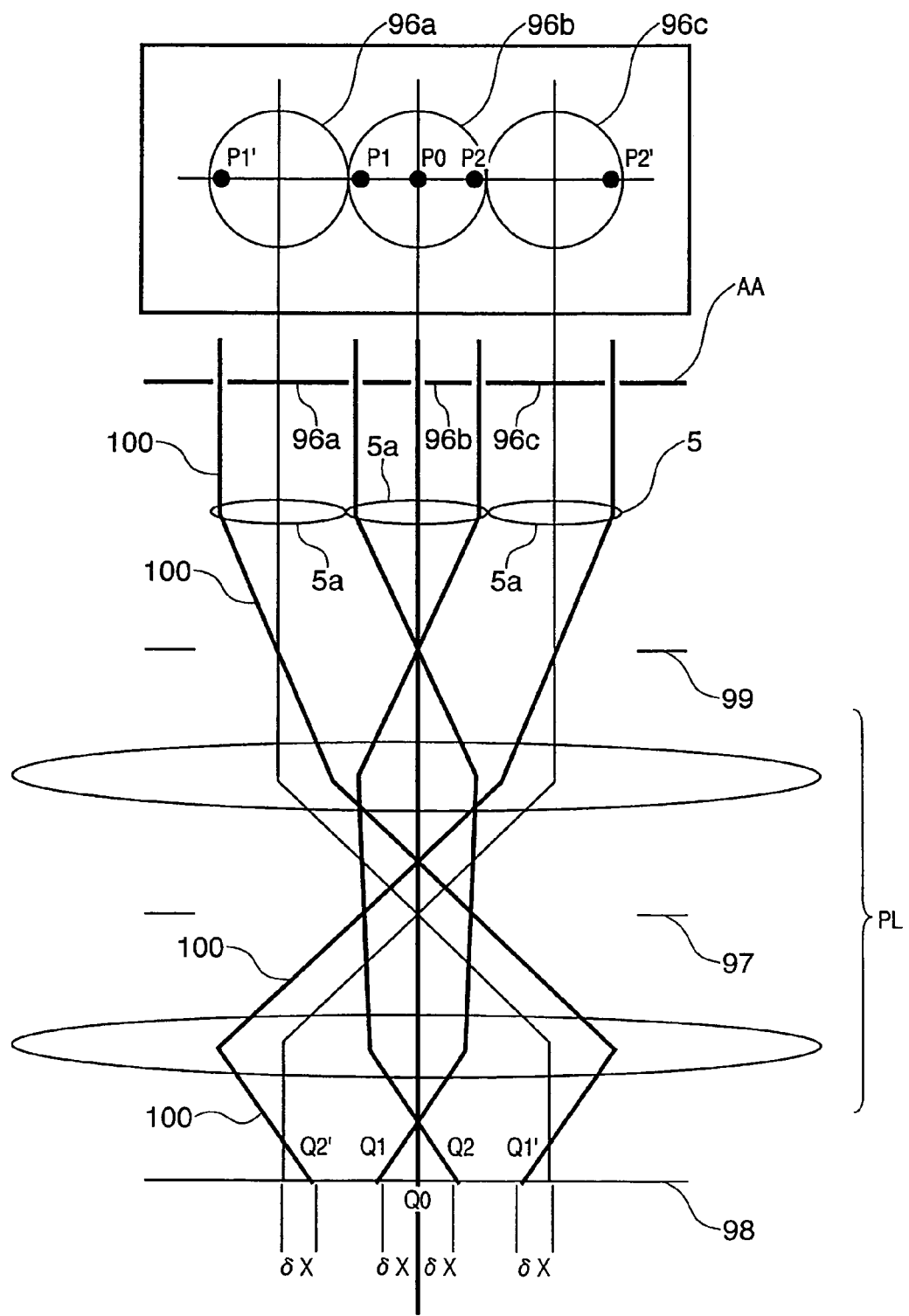
FIG. 5 is a view for explaining aberration measurement by the electron beam lithography machine to which the aberration adjusting method of the charged particle beam optical system in the lithography machine according to the embodiment of the present invention is applied.

FIG. 5 simplifies the optical system shown in FIG. 1 for descriptive convenience. The same reference numerals as those in FIG. 1 denote constituent elements with the same functions shown in FIG. 5.

The almost parallel electron beam from the optical system (not shown) is divided into the plurality of electron beams 100 by the aperture array AA. The divided electron beams 100 form the intermediate images 1a on an object plane 99 of the reduced optical projecting system PL. The intermediate images 1a are projected to an image plane 98 through the reduced optical projecting system PL. At this time, the apertures 96a, 96b, and 96c of the aperture array AA correspond to an exit pupil 97. The apertures 96a, 96b, and 96c of the aperture array AA in exposure are shown. In aberration measurement, as described above, an aperture to pass only specified beams must be formed in the plane of the exit pupil 97. An aperture to pass only beams from P0, P1, and P2 in the aperture 96b corresponding to the plane of the exit pupil 97 is provided. When positions Q0, Q1, and Q2 of the beams on the image plane 98 are measured, and δX1 and δX2 are measured, aberration is obtained. However, if aberration is small, Q0, Q1, and Q2 are separate and difficult to measure. An aperture to pass only a beam from not P1, but a position P1' corresponding to P1 in the aperture 96a as the next exit pupil plane, is provided. Similarly, an aperture to pass only a beam from not P2, but a position P2' corresponding to P2 in the aperture 96c as the next plane of the exit pupil 97, is provided. The beams from the apertures 96a, 96b, and 96c are regarded as beams with the same image height (i.e., same aberration). Positions Q1' and Q2' of the beams from the positions P1' and P2' on the image plane are measured, and the displacements δX1 and δX2 from the Gaussian image point are measured. Even when aberration is small, the positions Q1' and Q2' of the beams on the image plane can be separated. Hence, even small aberration can be measured.

The actual aperture array AA of this embodiment will be described next. FIG. 6A shows the aperture pattern for exposure of the aperture array. FIG. 6B shows the aperture pattern for aberration measurement.

An aperture pattern 90 for exposure shown in FIG. 6A is segmented into 5×5=25 blocks. An aperture pattern 89 for aberration measurement shown in FIG. 6B, which corresponds to the central aperture pattern, has the same apertures. In nine of the twenty-five blocks, the aperture pattern 89 for aberration measurement corresponding to the aperture pattern 90 for exposure has small apertures to pass only specified beams (corresponding to exit pupil positions ξ and η) in the aperture 90 for exposure. In these nine blocks, beams in the same block are regarded to have the same image height, and the image height at the block center is defined as a representative image height, as shown in FIGS. 6A and 6B. Aberration is measured in the above-described way. The remaining blocks have only the aperture pattern 89 for aberration measurement corresponding to the aperture pattern at the block center. Beams which pass for distortion measurement are set, as will be described later. In other words, a block indicates an image height.

Figure 7B:
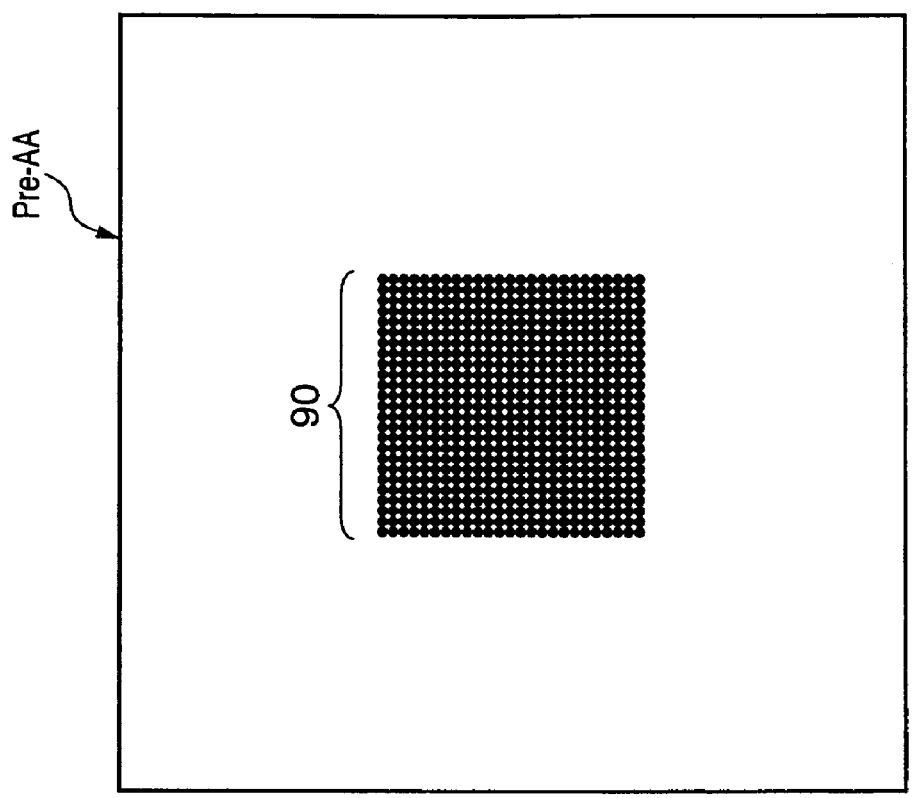
FIG. 7B is an explanatory view of the pre-aperture array of the electron beam lithography machine to which the aberration adjusting method of the charged particle beam optical system in the lithography machine according to the embodiment of the present invention is applied.
Figure 7A:
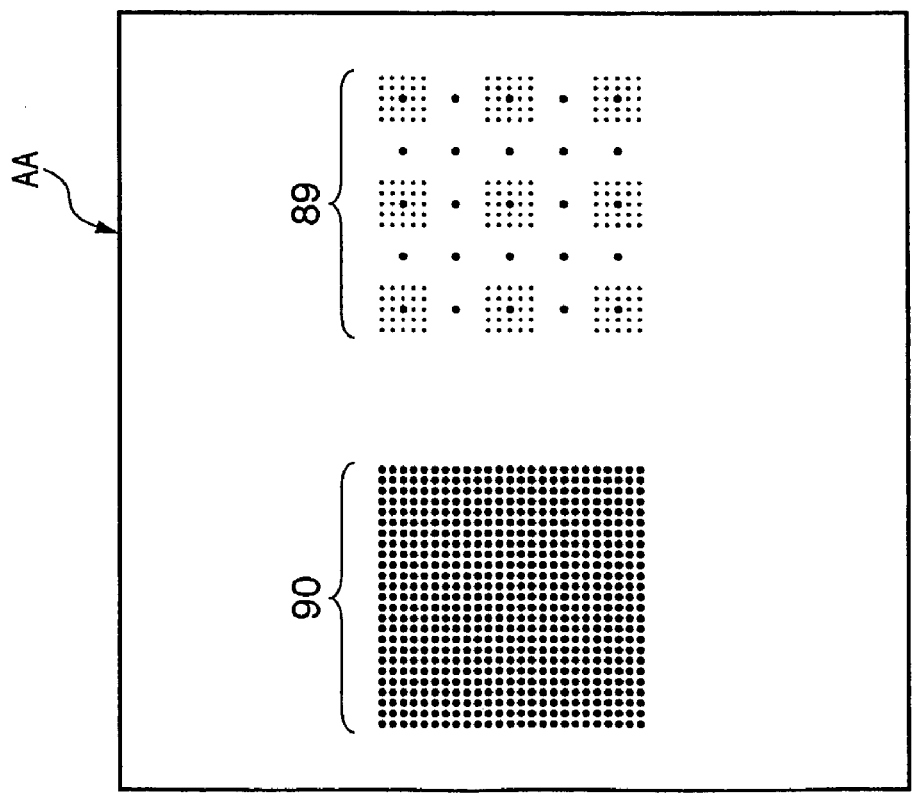
FIG. 7A is an explanatory view of the aperture array of the electron beam lithography machine to which the aberration adjusting method of the charged particle beam optical system in the lithography machine according to the embodiment of the present invention is applied.

In the aperture array AA shown in FIG. 1, the aperture pattern 90 for exposure shown in FIG. 6A and the aperture pattern 89 for aberration measurement shown in FIG. 6B are formed adjacent to one another, as shown in FIG. 7A.

The pre-aperture array Pre-AA shown in FIG. 7B is provided immediately above the aperture array AA. In the aperture pattern 90 for exposure of the pre-aperture array Pre-AA, apertures larger than those for exposure are formed in the same pattern, as described above. In exposure, the aperture array AA is moved so that the aperture pattern 90 for exposure is arranged immediately under the aperture pattern of the pre-aperture array Pre-AA. In aberration measurement, the aperture array AA is moved so that the aperture pattern 89 for aberration measurement is arranged immediately under the aperture pattern of the pre-aperture array Pre-AA.

Figures 8A, 8B:
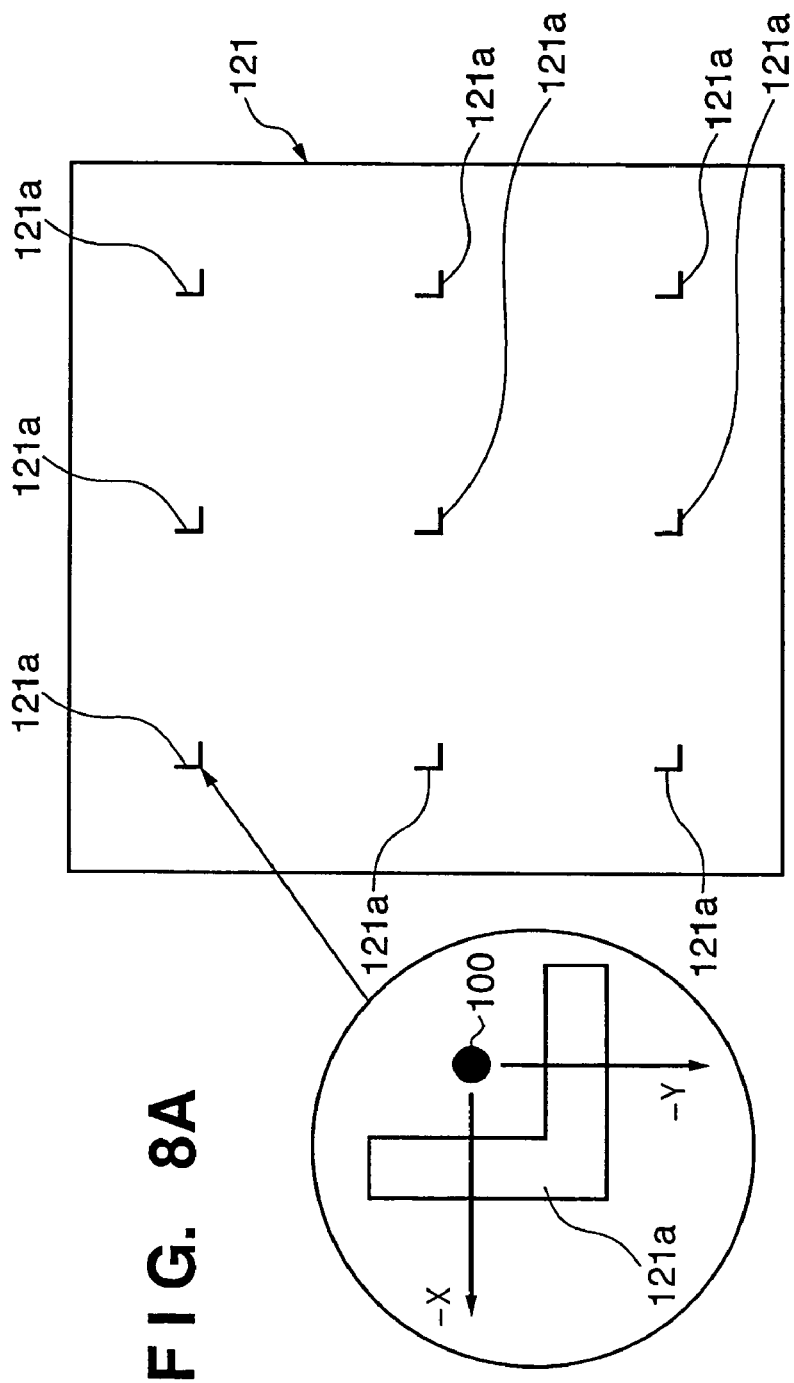
FIG. 8A is a plan view for explaining a semiconductor detector according to the first embodiment of the present invention.
FIG. 8B is a sectional view for explaining the semiconductor detector according the first embodiment of the present invention.

The semiconductor detector 12 of this embodiment, which is used in aberration measurement, will be described next with reference to FIGS. 8A and 8B.

The semiconductor detector 12 includes a substrate 121 having a plurality of apertures 121a, and semiconductor devices 122 (e.g., PIN photodiodes or avalanche diodes) corresponding to the apertures 121a of the substrate 121.

Each aperture 121a of the substrate 121 is formed in correspondence with the aperture located at the center of nine blocks of the aperture pattern 89 for aberration measurement shown in FIGS. 6B and 7A. The aperture 121a has an L-shape, as shown in FIG. 8A. When the electron beams 100 are scanned by a main deflector (not shown), and the electron beams 100 that have passed through the apertures 121a are detected by the semiconductor devices 122, the beam positions in the scanning direction can be detected on the basis of the signals from the semiconductor devices 122 and the positions of the apertures 121a.

The aberration measuring operation in the electron beam lithography machine of this embodiment will be described next with reference to FIG. 9. For aberration measurement of the lithography machine, the main controller 29 executes the following steps.

(Step S1) The main controller 29 instructs the AA moving circuit 28 to move the aperture pattern 89 for aberration measurement of the aperture array AA shown in FIG. 6B immediately under the pre-aperture array Pre-AA.

(Step S2) The main controller 29 instructs the stage control circuit 27 to move the nine apertures of the semiconductor detector 12 to positions where the electron beams 100 from apertures corresponding to the pupil positions (0, 0) of the nine blocks (image heights) of the aperture pattern 89 for aberration measurement strike.

Figure 10B:
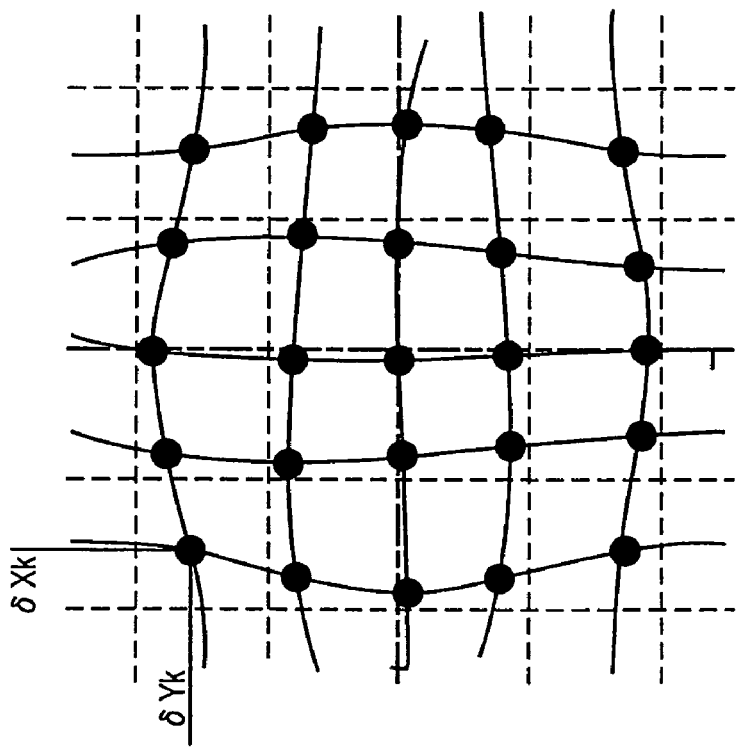
FIG. 10B is a view for explaining an image position in the electron beam lithography machine to which the aberration adjusting method of the charged particle beam optical system in the lithography machine according to the embodiment of the present invention is applied.
Figure 10A:
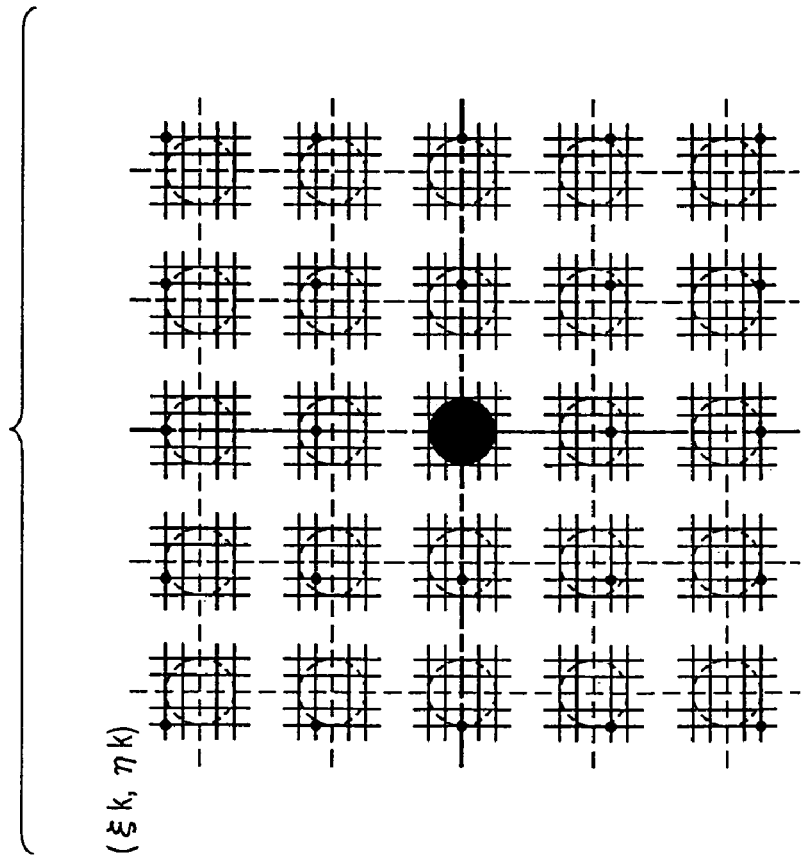
FIG. 10A is a view for explaining an aperture for aberration measurement in the electron beam lithography machine to which the aberration adjusting method of the charged particle beam optical system in the lithography machine according to the embodiment of the present invention is applied.

(Step S3) The main controller 29 instructs the stage control circuit 27 to select an aperture for aberration measurement corresponding to the pupil position ($\xi k$, $\eta k$) of each image height shown in FIG. 10A and input only the electron beam 100 from the aperture for aberration measurement to the semiconductor detector 12.

(Step S4) The main controller 29 instructs the deflector control circuit 23 to scan the selected electron beam 100 on the semiconductor detector 12 and also instructs the detecting circuit 26 to store the signal from the semiconductor detector 12.

(Step S5) On the basis of the aperture positions of the semiconductor detector 12, which are acquired in advance and the detection signal stored in the detecting circuit 26, the main controller 29 calculates and stores a displacement ($\delta Xk$, $\delta Yk$) between the designed image position and the actual image position of the electron beam 100 for each image height (Xi, Yi) and pupil position ($\xi k$, $\eta k$) shown in FIG. 10B.

(Step S6) When the main controller 29 detects beam positions from all the measurement target apertures of the nine image heights, the flow advances to step S7. Otherwise, the flow returns to step S3.

(Step S7) The main controller 29 detects, calculates, and stores $\delta Xk$ and $\delta Yk$ of the pupil position (0, 0) of the sixteen remaining image heights by the same step as for the nine image heights.

(Step S8) The main controller 29 reads stored ($\delta Xk$, $\delta Yk$) for each image height (Xi, Yi) and each pupil position ($\xi k$, $\eta k$).

(Step S9) The main controller 29 obtains a distortion function related to the following image height position (X, Y) by approximation of a function on the basis of $\delta X$, $\delta Y$ of the pupil position (0, 0) of each image height (Xi, Yi). Although the blocks are regarded to have the same image height, there is a slight distortion difference, which results in an aberration error. The distortion function is obtained to correct the error.

$\delta X = F(X,Y)$ $\delta Y = G(X,Y)$ (Step S10) From the distortion function, the pupil position ($\xi$, $\eta$) and $\delta X$, $\delta Y$ of each image height are corrected to obtain $\delta X'$, $\delta Y'$.

$\delta X' = \delta X - F(X,Y)$ $\delta Y' = \delta Y - G(X,Y)$ where (X, Y) is the actual image height position of pupil position ($\xi$, $\eta$) of each image height.

(Step S11) On the basis of the pupil position ($\xi$, $\eta$), $\delta X'$, $\delta Y'$ of each image height, the Zernike coefficient of image height is obtained. The wave aberration W ($\eta$, $\theta$) can finally be obtained by using the Zernike coefficient Cn and Zernike cylindrical system Zn ($\eta$, $\theta$).

Second Embodiment (Device Production Method)

An embodiment of a device production method using the above-described electron beam lithography machine will be described next.

Figure 11:
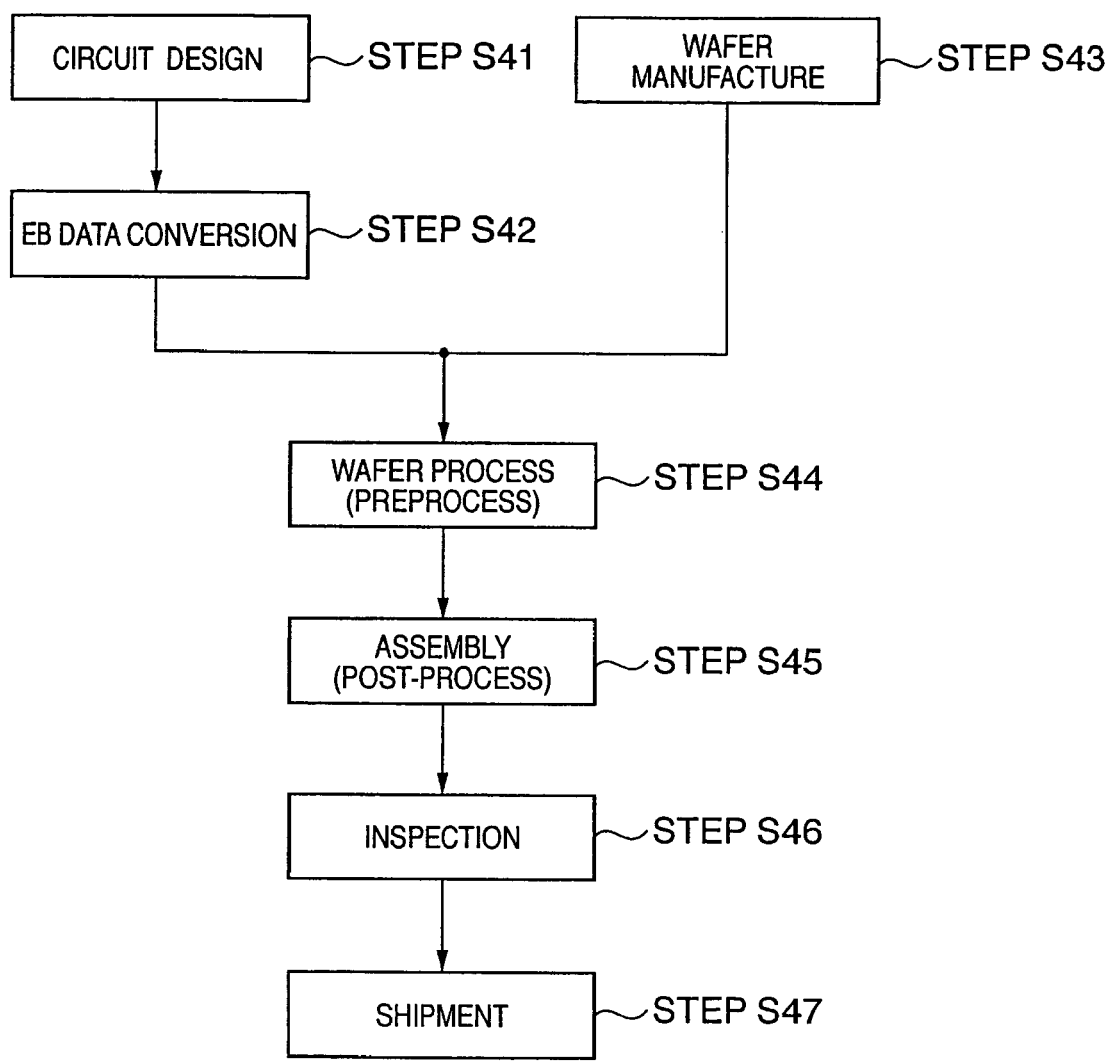
FIG. 11 is an explanatory view of the flow of a device fabrication method by the lithography machine according to the embodiment of the present invention.

FIG. 11 shows the flow of fabrication of a micro device (e.g., a semiconductor chip, such as an IC or LSI, a liquid crystal panel, a CCD, a thin-film magnetic head, or a micromachine).

In step S41 (circuit design), the circuit of a semiconductor device is designed.

In step S42 (exposure control data creation), exposure control data of the lithography machine is created on the basis of the designed circuit pattern.

In step S43 (wafer manufacture), a wafer is manufactured by using a material such as silicon.

In step S44 (wafer process), called a preprocess, an actual circuit is formed on the wafer by lithography using the wafer and the lithography machine to which the prepared exposure control data is input.

In step S45 (assembly), called a post-process, a semiconductor chip is formed from the wafer prepared in step S44. This step includes processes such as assembly (dicing and bonding) and packaging (chip encapsulation).

In step S46 (inspection), inspections including an operation check test and a durability test of the semiconductor device prepared in step S45 are performed.

A semiconductor device is completed with these processes and shipped (step S47).

Figure 12:
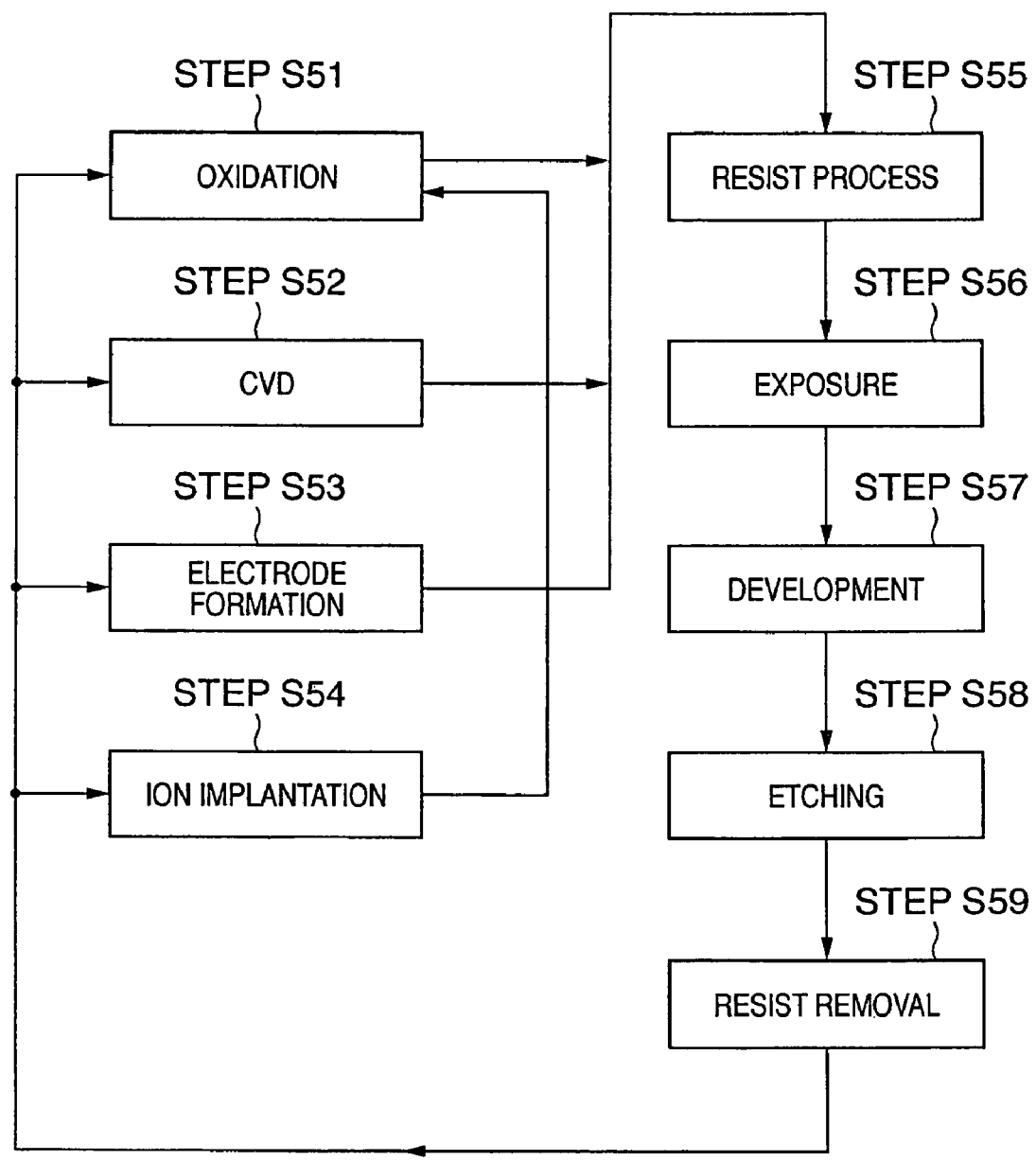
FIG. 12 is an explanatory view of a wafer process in the device fabrication method by the lithography machine according to the embodiment of the present invention.

The wafer process in step S44 in FIG. 11 will be described next in detail with reference to FIG. 12.

In step S51 (oxidation), the surface of the wafer is oxidized.

In step S52 (CVD), an insulating film is formed on the wafer surface.

In step S53 (electrode formation), an electrode is formed on the wafer by deposition.

In step S54 (ion implantation), ions are implanted into the wafer.

In step S55 (resist process), a photosensitizer is applied to the wafer.

In step S56 (exposure), the circuit pattern is printed on the wafer by exposure using the above-described lithography machine.

In step S57 (development), the exposed wafer is developed.

In step S58 (etching), portions other than the developed resist image are etched.

In step S59 (resist removal), any unnecessary resist remaining after etching is removed.

By repeating these steps, a multilayered structure of circuit patterns is formed on the wafer.

According to the device fabrication method by the lithography machine of the embodiment of the present invention, a highly integrated semiconductor device that is conventionally hard to fabricate can be fabricated at a low cost.

As many apparently widely different embodiments of the present invention can be made without departing from the spirit and scope thereof, it is to be understood that the invention is not limited to the specific embodiments thereof except as defined in the appended claims.

This application claims the benefit of Japanese Application No. 2005-017698, filed on Jan. 26, 2005, which is hereby incorporated by reference herein in its entirety.

What is claimed is:

1. A charged particle beam lithography machine for exposing a target exposure surface by using a plurality of charged particle beams, said machine comprising:
   a charged particle source to emit a charged particle beam;
   an aperture substrate which has a plurality of apertures to divide the charged particle beam from said charged particle source into a plurality of charged particle beams;
   a plurality of electron optical systems which have the apertures as pupils;
   a charged particle beam optical system which projects, to the target exposure surface, charged particle source images formed by said plurality of electron optical systems;
   a unit adapted to set the apertures of said aperture substrate to an aperture for exposure and an aperture for aberration measurement to make the plurality of charged particle beams strike said charged particle beam optical system at different incident angles; and
   a detecting unit adapted to detect a position where the plurality of charged particle beams, which have passed through the aperture for aberration measurement, form images on an image surface of said charged particle beam optical system.

2. The machine according to claim 1, wherein an aberration is obtained on the basis of a detection result from said detecting unit and a distortion of said charged particle beam optical system.

3. The machine according to claim 1, wherein the plurality of charged particle beams, which have passed through the aperture for aberration measurements pass through different object planes, and the aberration is obtained by regarding the object planes as the same image height.

4. The machine according to claim 2, wherein the aperture for aberration measurement makes the plurality of charged particle beams strike an object plane of said charged particle beam optical system at an equal incident angle, said detecting unit detects the image positions, and the distortion is obtained on the basis of the detection result.

5. The machine according to claim 2, further comprising a calculating unit adapted to divide the aberration into components by using a Zernike coefficient.

6. A device fabrication method of fabricating a device, said method comprising steps of:
   exposing an exposure target by using a charged particle beam lithography machine of claim 1; and
   developing the exposed exposure target.

* * * * *

UNITED STATES PATENT AND TRADEMARK OFFICE
CERTIFICATE OF CORRECTION

PATENT NO. : 7,378,671 B2
APPLICATION NO. : 11/337603
DATED : May 27, 2008
INVENTOR(S) : Masato Muraki et al.

It is certified that error appears in the above-identified patent and that said Letters Patent is hereby corrected as shown below:

COLUMN 1:
  Line 57, "No. 9-2145708" should read -- No. 9-245708 --.

COLUMN 6:
  Line 55, "$W(\rho, \theta) = {}_n^\Sigma CnZn(\rho, \theta)$" should read -- $W(\rho,\theta) = \sum_n CnZn(\rho,\theta)$ --.

COLUMN 7:
  Line 23, "C16   $20\rho^5 - 30\rho^4 + 12\rho^2 + 1$   spherical" should read
  -- C16   $20\rho^6 - 30\rho^4 + 12\rho^2 + 1$   spherical --.

COLUMN 10:
  Line 1, "$W(\eta, \theta)$" should read -- $W(\rho, \theta)$ --.
  Line 3, "$Zn (\eta, \theta)$." should read -- $Zn (\rho, \theta)$. --.

COLUMN 12:
  Line 7, "measurements" should read -- measurement --.

Signed and Sealed this

Eleventh Day of November, 2008

JON W. DUDAS
*Director of the United States Patent and Trademark Office*